(12) United States Patent
Fournel et al.

(10) Patent No.: US 8,298,942 B2
(45) Date of Patent: Oct. 30, 2012

(54) METHOD FOR FORMING ELECTRIC VIAS

(75) Inventors: Richard Fournel, Lumbin (FR); Yves Dodo, Moirans (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/070,774

(22) Filed: Mar. 24, 2011

(65) Prior Publication Data
US 2011/0237068 A1   Sep. 29, 2011

(30) Foreign Application Priority Data

Mar. 24, 2010   (FR) ...................................... 10 52110

(51) Int. Cl.
*H01L 21/28* (2006.01)

(52) U.S. Cl. ................ 438/667; 438/698; 257/E23.011; 257/E21.597; 257/E23.067; 257/E23.174

(58) Field of Classification Search .................. 438/667, 438/698; 257/621, E23.011, E21.597, E23.067, 257/698, E23.174
See application file for complete search history.

(56) References Cited

U.S. PATENT DOCUMENTS

| 5,618,752 | A * | 4/1997 | Gaul ............................. 438/626 |
| 7,338,896 | B2 * | 3/2008 | Vanhaelemeersch et al. 438/638 |
| 2006/0267206 | A1 * | 11/2006 | Tanida et al. ................. 257/773 |
| 2008/0272498 | A1 | 11/2008 | Yu et al. |
| 2009/0283871 | A1 * | 11/2009 | Chang et al. .................. 257/621 |
| 2010/0032764 | A1 * | 2/2010 | Andry et al. .................. 257/369 |
| 2010/0032808 | A1 | 2/2010 | Ding et al. |
| 2010/0130008 | A1 * | 5/2010 | Smith ............................. 438/667 |
| 2011/0095435 | A1 * | 4/2011 | Volant et al. .................. 257/774 |
| 2011/0108958 | A1 * | 5/2011 | Webb ............................. 257/621 |
| 2011/0195572 | A1 * | 8/2011 | Uchiyama ..................... 438/667 |

* cited by examiner

*Primary Examiner* — George Fourson, III
(74) *Attorney, Agent, or Firm* — Seed IP Law Group PLLC

(57) ABSTRACT

A method for forming through vias connecting the front surface to the rear surface of a semiconductor substrate, including the steps of: forming openings in the substrate, thermally oxidizing walls of the openings, filling the openings with a sacrificial material, forming electronic components in the substrate, etching the sacrificial material, filling the openings with a metal, and etching the rear surface of the substrate all the way to the bottom of the openings.

19 Claims, 2 Drawing Sheets

METHOD FOR FORMING ELECTRIC VIAS

BACKGROUND

1. Technical Field

The present disclosure relates to a method for forming an insulated electric connection between the front surface and the rear surface of a substrate. This electric connection is currently designated in the art as a through silicon via or TSV.

2. Description of the Related Art

In some electronic devices, chips are stacked. This increases the functions carried out by this type of device, without increasing the occupied surface area. A large selection of technological platforms is available for this purpose.

In such devices, to connect the different chips, it can be provided to use known techniques of wire bonding or vias crossing the semiconductor substrate of the chips.

In addition to being able to be collectively formed in silicon wafers, vias have the advantage of improving the electric performance of devices.

A known via forming method is the following. Once the electronic components have been made in the semiconductor substrate (this substrate being possibly thinned down), through vias are formed. Openings are created in the rear surface of the substrate by dry etch or chemical etch. The walls of each of the openings are then insulated by deposition of a silicon oxide layer by a method of chemical vapor deposition (CVD) type. The openings are filled with copper, by the use of an electrolytic growth method. A through via is thus obtained. Since the vias are insulated after the electronic components have been formed, the silicon oxide deposition method is submitted to thermal stress. The insulator may not be formed at a temperature exceeding 200° C. In such conditions, the silicon oxide can only be deposited by a low-temperature CVD type method. The obtained insulator is of poor quality and is not conformal. It has a degraded electric performance.

Further, when the vias are formed from the rear surface, the alignment references with respect to the front surface are lost. To provide a sufficient insulation between vias, the distance separating them is increased. The via integration density is thus decreased.

To overcome these disadvantages, it may be provided to form the through vias before forming the electronic components in the substrate. The substrate is first etched to form a plurality of openings. A step of thermal oxidation of the opening walls is then carried out. This step, performed at approximately 1,000° C., provides an insulator of good conformality. A filling with polysilicon is then performed. However, this material is very resistive. A filling with a metal such as aluminum, tungsten, or copper cannot be performed since these metals tend to diffuse into the substrate through the insulator during the anneal steps to form the components.

BRIEF SUMMARY

An embodiment of the present disclosure provides a method for forming through vias avoiding at least some of the disadvantages of usual via forming methods.

Another embodiment of the present disclosure is to provide a method for forming through vias capable of being used in high-voltage and high-insulation applications.

Another embodiment of the present disclosure is to provide a method for forming through vias enabling to increase the density of vias in the semiconductor substrate, as well as the accuracy of their positioning.

Thus, an embodiment of the present disclosure provides a method for forming through vias connecting the front surface to the rear surface of a semiconductor substrate, comprising the steps of:

a) forming openings in the substrate,
b) thermally oxidizing walls of the openings,
c) filling the openings with a sacrificial material,
d) forming electronic components in the substrate,
e) etching the sacrificial material,
f) filling the openings with a metal, and
g) etching the rear surface of the substrate all the way to the bottom of the openings.

According to an embodiment of the present disclosure, steps a) to g) occur in the indicated order.

According to an embodiment of the present disclosure, step g) occurs between steps d) and e).

According to an embodiment of the present disclosure, the semiconductor material is silicon.

According to an embodiment of the present disclosure, the sacrificial material is silicon-germanium or polysilicon.

According to an embodiment of the present disclosure, the etching of the sacrificial material is performed by photolithography.

According to an embodiment of the present disclosure, the sacrificial material is silicon oxide.

According to an embodiment of the present disclosure, the metal is selected from the group comprised of copper, tungsten, and aluminum.

The foregoing features and advantages of the present disclosure will be discussed in detail in the following non-limiting description of specific embodiments in connection with the accompanying drawings.

DETAILED DESCRIPTION

Figure 1A:
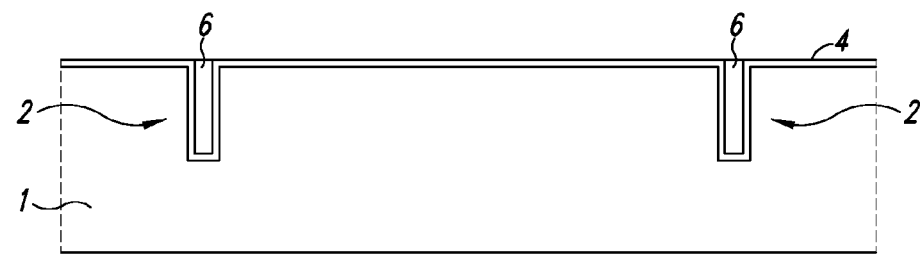
FIGS. 1A to 1E are cross-section views illustrating steps of forming through vias, according to an embodiment of the present disclosure.

For clarity, the same elements have been designated with the same reference numerals in the different drawings and, further, as usual in the representation of integrated circuits, the various drawings are not to scale.

FIGS. 1A to 1E are simplified cross-section views illustrating steps of forming through vias in a semiconductor substrate 1.

In FIG. 1A, openings 2 have been formed in substrate 1 by dry or wet etch of the semiconductor material, which advantageously is silicon. A thermal oxidation of the opening walls has then been carried out. A silicon oxide layer 4 having a thickness ranging between 0.1 and 1.5 μm, preferably between 0.2 and 1 μm, has been obtained. Openings 2 have then been filled with a sacrificial material 6. Sacrificial material 6 for example is silicon-germanium or polysilicon.

Figure 1B:
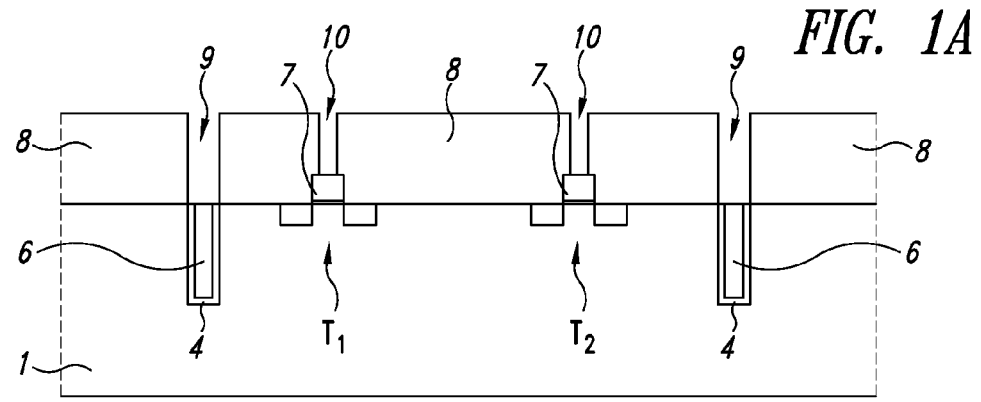

In FIG. 1B, MOS transistors $T_1$ and $T_2$ have been formed in substrate 1. Each of the transistors, very schematically shown, comprises a gate 7 and source and drain areas arranged on either side of the gate. A full-wafer insulating layer 8 has then been deposited. As an example, the insulator 8 may be oxide obtained from TEOS (TetraEthyl OrthoSilicate). Openings 9 have been etched by photolithography in layer 8 above the openings 2 filled with sacrificial material 6, and openings 10 have been etched above the regions of the components where a contact is desired to be made (gates 7 in the shown example).

Figure 1C:
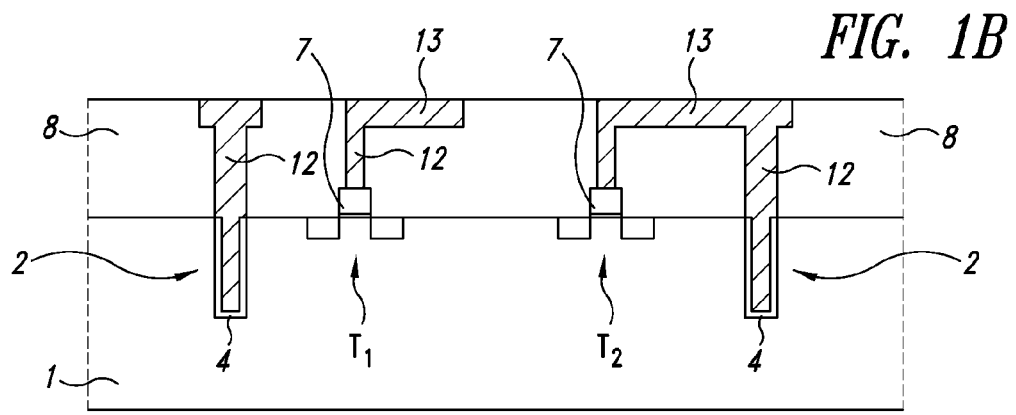

In FIG. 1C, sacrificial material 6 has been removed by selective etching. As an example, it may be provided to use a wet etch method. A first metal layer has been deposited in openings 2, 9, and 10 to form vias 12 of the first metal level. A second metal layer has been deposited to form metal lines 13 in contact with the vias 12. For clarity, the metal layer has been hatched in the different drawings. As an example, the metal may be aluminum, tungsten, or copper.

Figure 1D:
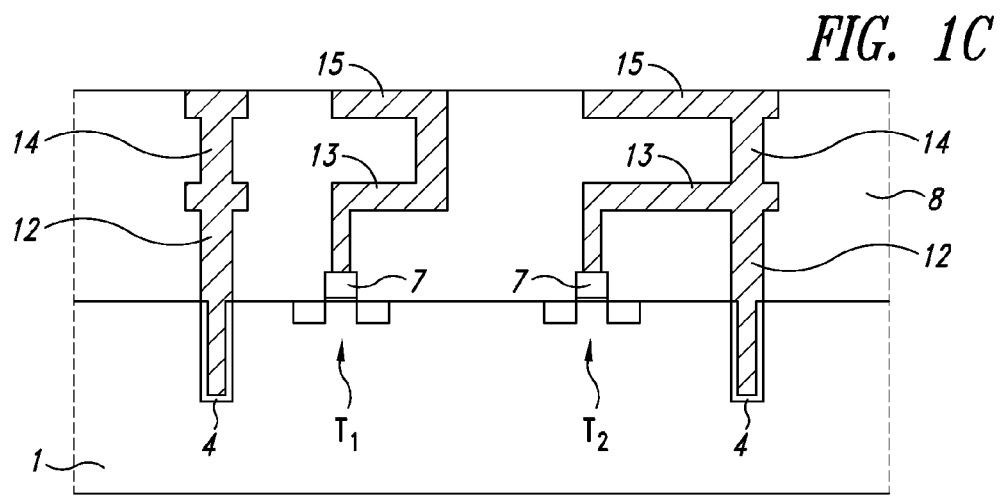

In FIG. 1D, a second metal level has been formed. Vias 14 and lines 15 of the second metal level are of the same metal as the first metal level. As a variation, the metal may be different, that is, aluminum, tungsten, or copper, according to the needs of the technology. Vias 14 which advantageously are of same dimension have thus been formed.

Figure 1E:
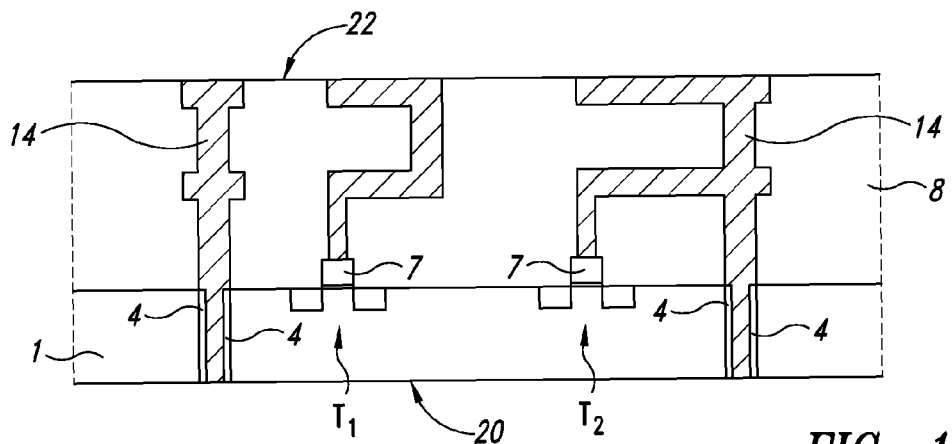

In FIG. 1E, a chemical-mechanical polishing of the rear surface 20 of substrate 1 has been performed to define an access to vias 12, 14. So-called through vias 12, 14 connect the front surface 22 to the rear surface 20 of substrate 1. Vias 12, 14 may have a height ranging between 20 and 350 µm. The diameter of the vias may range between 1 and 30 µm. This type of via 12, 14 enables the electrical connection of stacked chips. It also enables the transfer of the connection to the rear surface 20, while said connection is usually taken on the front surface 22.

If the device obtained in FIG. 1D has a thickness smaller than approximately 180 µm, it is provided to attach it to a handle before the polishing step. The handling of the substrate is thus eased.

For simplification, it has been chosen to only shown two metal levels. In practice, there will be more than two metal levels.

According to an advantage of the above-described method, this method enables forming vias with a metal having satisfactory conduction properties.

According to another advantage of the above-described method, the vias have a significant insulation quality since oxide 4 is a thermal oxide of good quality. The insulation quality enables use of the chip for high-voltage, high-insulation, or radio frequency applications.

According to another advantage of the above-described method, since openings 2 have been formed before the electronic components, there is no alignment problem at the time when the vias are opened at the rear surface at the end of the method. The vias can thus be placed closer to one another, which enables an increase in the integration density in the substrate 1.

Figure 2C:
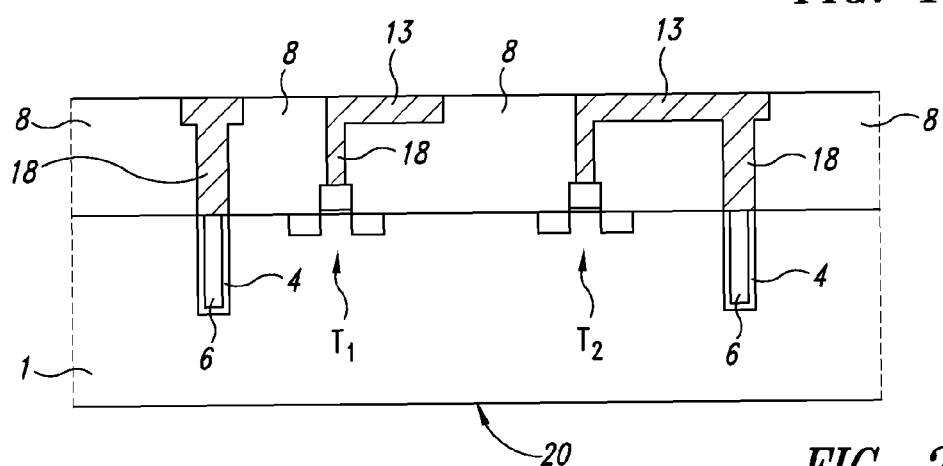
FIGS. 2C and 2D are cross-section views illustrating steps of forming through vias, according to another embodiment of the present disclosure.
Figure 2D:
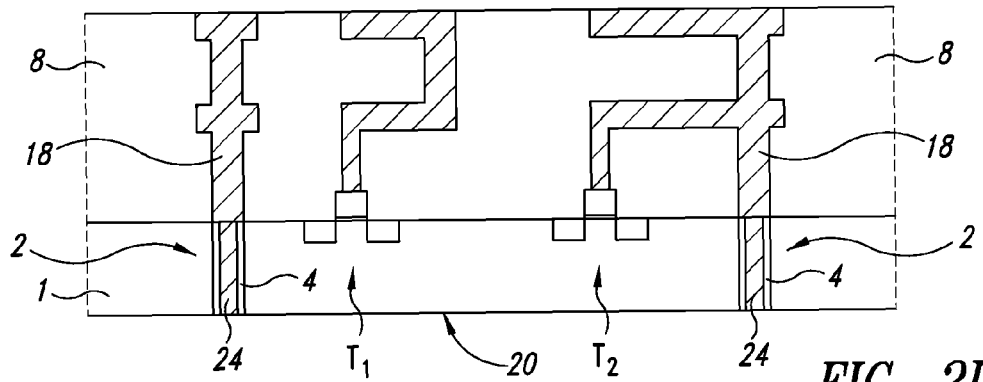

FIGS. 2C and 2D are simplified cross-section views illustrating steps of forming vias and of their opening at the rear surface 20.

The steps preceding those shown in FIG. 2C are identical to those illustrated in FIGS. 1A and 1B.

In FIG. 2C, while the electronic components have been formed in the silicon and no high-temperature anneal step is provided, a first metal layer has been deposited in openings 9 and 10 to form vias 18. After this, the second metal layer has been deposited in to form the lines 13 of the first metal level.

In FIG. 2D, a second metal level has been formed. A chemical-mechanical polishing of the rear surface 20 of substrate 1 has then been performed, to have access to openings 2 filled with sacrificial material 6.

FIG. 2D corresponds to FIG. 1E. Sacrificial material 6 has been etched selectively over insulating layer 4 and metal 18, from the rear surface 20. In the openings 2 thus formed, a metal layer 24 identical to the metal layer in via 18 deposited to form the metal levels has been formed. As a variation, it may be decided to use a different metal to fill openings 2.

As a variation, it may be envisaged to use the thermal oxide forming layer 4 as a sacrificial material. In this embodiment, openings 2 are integrally filled with the thermal oxide. Before etching the sacrificial material, a photolithography step is performed. It is ascertained to keep an insulating layer on the opening walls. The thickness of this insulating layer may range between 0.2 and 5 µm, preferably, between 0.2 and 1 µm.

Specific embodiments of the present disclosure have been described. Different variations and modifications will occur to those skilled in the art. In particular, the semiconductor substrate may be of SOI type (Silicon On Insulator). Further, for clarity, the deposition of a barrier layer, Ti—TiN, on insulating layer 4, has not been shown. The titanium layer is capable of bonding to insulating layer 4, while the titanium nitride is capable of forming an interface layer between insulating layer 4 and the metal level of the via. It may further be provided to use a barrier layer based on tantalum Ta—TaN. The deposition of the barrier layer for example is a physical vapor deposition (PVD). As a variation, it may be provided to simultaneously form the vias and the lines of a same metal level.

Various embodiments with different variations have been described hereabove. It should be noted that those skilled in the art may combine various elements of these various embodiments and variations.

Such alterations, modifications, and improvements are intended to be part of this disclosure, and are intended to be within the spirit and the scope of the present disclosure. Accordingly, the foregoing description is by way of example only and is not intended to be limiting.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method, comprising:
    forming openings in a semiconductor substrate, each opening having walls;
    thermally oxidizing the walls of the openings;
    filling the openings with a sacrificial material;
    forming electronic components in the substrate;
    etching the sacrificial material;
    forming a plurality of vias by filling the openings with a metal; and
    etching a rear surface of the substrate to a bottom of the vias, wherein the etching of the rear surface occurs prior to etching the sacrificial material.

2. The method of claim 1, wherein the semiconductor material is silicon.

3. The method of claim 1, wherein the sacrificial material is silicon-germanium or polysilicon.

4. The method of claim 1, wherein a chemical mechanical polish etches the rear surface of the substrate.

5. The method of claim 4, wherein the sacrificial material is silicon oxide.

6. The method of claim 1, wherein the metal is selected from the group consisting of copper, tungsten, and aluminum.

7. A method, comprising:
forming a plurality of first openings in a first surface of a substrate;
forming a sacrificial material in the openings;
forming a plurality of electronic components on the substrate adjacent to the openings;
forming a plurality of second openings aligned with the plurality of first openings;
partially forming a plurality of vias by filling the second openings with a first conductive material;
removing portions of a second surface of the substrate to expose the sacrificial material in the first openings;
removing the sacrificial material from the first openings;
forming the plurality of vias by filling the first openings with a second conductive material, the first conductive material coupled to the second conductive material.

8. The method of claim 7 wherein the first and second conductive material are the same material.

9. The method of claim 7 wherein the first and second conductive material are different materials.

10. The method of claim 7, further comprising forming a dielectric layer in the plurality of first openings prior to forming the sacrificial material.

11. The method of claim 7, further comprising:
forming a first insulating layer on the electronic components and on the first surface of the substrate;
forming the plurality of second openings through the first insulating layer; and
forming a first barrier layer in the second openings prior to filling the second openings with the first conductive material.

12. The method of claim 11, further comprising:
forming a second insulating layer on the first insulating layer;
forming a plurality of third openings aligned with the first and second openings;
forming a second barrier layer in the third openings; and
filling the third openings with a third conductive material.

13. The method of claim 12 wherein the third conductive material is of the same material as the second conductive material.

14. A method, comprising:
forming a plurality of first openings in a first surface of a substrate;
forming silicon oxide in the openings;
forming a plurality of electronic components on the substrate adjacent to the openings;
forming a plurality of second openings aligned with the plurality of first openings;
removing the silicon oxide from the first openings;
filling the first and second openings with a first conductive material; and
removing portions of a second surface of the substrate to expose the conductive material in the first openings.

15. The method of claim 14, further comprising forming a dielectric layer in the plurality of first openings prior to forming the silicon oxide.

16. The method of claim 14, further comprising:
forming a first insulating layer on the electronic components and on the first surface of the substrate; and
forming the plurality of second openings through the first insulating layer.

17. The method of claim 16, further comprising:
forming a second insulating layer on the first insulating layer;
forming a plurality of third openings aligned with the first conductive material in the first and second openings; and
filling the third openings with a second conductive material.

18. The method of claim 17 wherein the second conductive material is of the same material as the first conductive material.

19. The method of claim 17 wherein the second conductive material is of a different material than the first conductive material.

* * * * *